US006813215B2

(12) United States Patent
Carter

(10) Patent No.: US 6,813,215 B2
(45) Date of Patent: Nov. 2, 2004

(54) MEMORY HAVING MULTIPLE WRITE PORTS AND METHOD OF OPERATION

(75) Inventor: Richard J. Carter, Los Altos, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 19 days.

(21) Appl. No.: 10/326,091

(22) Filed: Dec. 23, 2002

(65) Prior Publication Data

US 2004/0120207 A1 Jun. 24, 2004

(51) Int. Cl.$^7$ ................................................. G11C 7/00
(52) U.S. Cl. .............................. 365/230.05; 365/189.01
(58) Field of Search ....................... 365/230.05, 189.01, 365/189.02, 189.04, 230.01, 230.02, 189.05

(56) References Cited

U.S. PATENT DOCUMENTS

| | | | |
|---|---|---|---|
| 5,325,504 A | | 6/1994 | Tipley et al. |
| 5,563,829 A | | 10/1996 | Huang |
| 5,629,901 A | * | 5/1997 | Ho ........................ 365/230.05 |
| 5,802,003 A | * | 9/1998 | Iadanza et al. ........ 365/230.03 |
| 5,923,608 A | | 7/1999 | Payne |
| 5,940,603 A | | 8/1999 | Huang |
| 6,005,794 A | | 12/1999 | Sheffield et al. |
| 6,078,995 A | | 6/2000 | Bewick et al. |
| 6,104,663 A | | 8/2000 | Rablanian |
| 6,151,258 A | * | 11/2000 | Sample et al. ......... 365/189.05 |
| 6,212,122 B1 | | 4/2001 | Wen |
| 6,216,205 B1 | | 4/2001 | Chin et al. |
| 6,233,659 B1 | | 5/2001 | Cohen et al. |
| 6,243,294 B1 | | 6/2001 | Rao et al. |
| 6,271,866 B1 | | 8/2001 | Hancock et al. |
| 6,282,143 B1 | | 8/2001 | Zhang et al. |

OTHER PUBLICATIONS

H. Liu et al., Cache, Matrix Multiplication and Vector, Introduction of Cache Memory, Summer 2001, 14 pages.
Smith, A Comparative Study Of Set Associative Memory Mapping Algorithms and Their use For Cache And Main Memory, IEEE; Transactions Of Software Enginneering., vol. SE–4., No. 2, Mar. 1978, pp. 121–122 and 129–130.
Maruyama, mLRU Page Replacement Algorithm In Ters Of The Reference Matrix, IBM Technical Disclosure Bulletin, vol. 17, No. 10, Mar. 1975, pp. 3101–3103.
Maruyama, Implementation of the Stack Operation Circuit For LRU Algorithm, IBM Technical Disclosure Bulletin, vol. 19, No. 1, Jun. 1976, pp. 321–325.
Smith, Cache Memories., University of CA., Berkeley, CA, Computing Surveys, vol. 14, No. 3, Sep., 1982, pp. 473–530.

* cited by examiner

Primary Examiner—Vu A. Le

(57) ABSTRACT

Exemplary embodiments of the present invention are directed to providing a memory having N write ports, where N is greater than one. The memory includes a first data memory unit having a plurality of storage locations addressable by a range of addresses and having less than N write ports; the memory also includes a second data memory unit having a plurality of storage locations addressable by the range of addresses, the second data memory having less than N write ports. The memory further includes a control unit configured to select among the first and second memory units in response to a read command having an associated read address which falls within the address range. The control unit includes multiple control memory units each with less than N write ports.

22 Claims, 8 Drawing Sheets

MEMORY HAVING MULTIPLE WRITE PORTS AND METHOD OF OPERATION

RELATED APPLICATIONS

The patent applications MEMORY HAVING MULTIPLE WRITE PORTS AND MULTIPLE CONTROL MEMORY UNITS, AND METHOD OF OPERATION, Carter, Ser. No. 10/326,779 and MEMORY HAVING MULTIPLE WRITE PORTS AND WRITE INSERT UNIT, AND METHOD OF OPERATION, Carter, Ser. No. 10/326,405, are filed concurrently with the present application and incorporated herein by reference.

BACKGROUND

1. Field of the Invention

The present invention relates generally to memory devices, and more particularly, to providing a more capable memory from less capable memory components.

2. Background Information

It is known to combine multiple memory components, such as static random access memory devices, to produce a larger memory array having enhanced capability. For example, smaller memory components can be combined in an array to form a wider memory (i.e., a memory wherein the addressable locations include a larger number of bits). Each of the smaller memory components that form the array have common address and control signals, but have separate data in and data out signals. Alternately, smaller memory components can be combined into an array to form a larger memory of increased depth (i.e., a memory with a large number of addressable locations). Such arrays involve the use of decoders and read data multiplexers. In combining smaller memory components to form a memory array, focus has been on the desired width or depth of the memory array, and the address signals used.

Some design systems allow designers to create a circuit of connected components selected from a design library. The maximum number of write ports on any memory device to be included in the circuit is limited by the memory components available in the design library. For the case of Field Programmable Gate Arrays (FPGAs), the design library includes the primitive hardware structures of the FPGA (e.g. configurable logic blocks or block RAMs) and any higher-level design elements provided by a "core generator" or other such FPGA design tools. Similarly, for Application Specific Integrated Circuits (ASICs), the design library includes a fixed number of standard-cell or other pre-verified component designs. For these and other technologies, any design that involves a memory with more than the maximum number of write ports supported by the design library is unrealizable in that technology.

SUMMARY OF THE INVENTION

Exemplary embodiments of the present invention are directed to providing a memory having N write ports, where N is greater than one. The memory includes a first data memory unit having a plurality of storage locations addressable by a range of addresses and having less than N write ports; the memory also includes a second data memory unit having a plurality of storage locations addressable by the range of addresses, the second data memory having less than N write ports. The memory further includes a control unit configured to select among the first and second memory units in response to a read command having an associated read address which falls within the address range. The control unit includes multiple control memory units each with less than N write ports.

Exemplary embodiments of the present invention are also directed to a method for operating a memory including the steps of providing a memory having N write ports, where N is greater than one. The memory is constructed from multiple data memory units each having less than N write ports and a range of addressable storage locations, and a control unit including multiple control memory units, each with less than N write ports. The method comprises supplying information to an addressable location of the memory which falls within the range of addressable locations, and updating the at least one control memory unit in the control unit so that the data in the control memory unit for the addressable storage location can be used to determine the data memory unit that contains the most recently written data for the addressable location.

Exemplary embodiments of the present invention are further directed to a system including a memory. The memory has N write ports, wherein N is greater than 1. The memory includes a first data memory unit having a plurality of storage locations addressable by a range of addresses. The first data memory unit has less than N write ports. The memory includes a second data memory unit having a plurality of storage locations addressable by the range of addresses. The second data memory unit has less than N write ports. The memory includes a control unit configured to select among the first data memory unit and the second data memory unit in response to a read command having an associated read address which falls within the address range. The control unit includes multiple control memory units each with less than N write ports. The system includes logic configured to access the memory.

BRIEF DESCRIPTION OF THE DRAWINGS

Other objects and advantages of the present invention will become apparent to those skilled in the art upon reading the following detailed description of preferred embodiments, in conjunction with the accompanying drawings wherein.

DETAILED DESCRIPTION OF EXEMPLARY EMBODIMENTS

Figure 1:
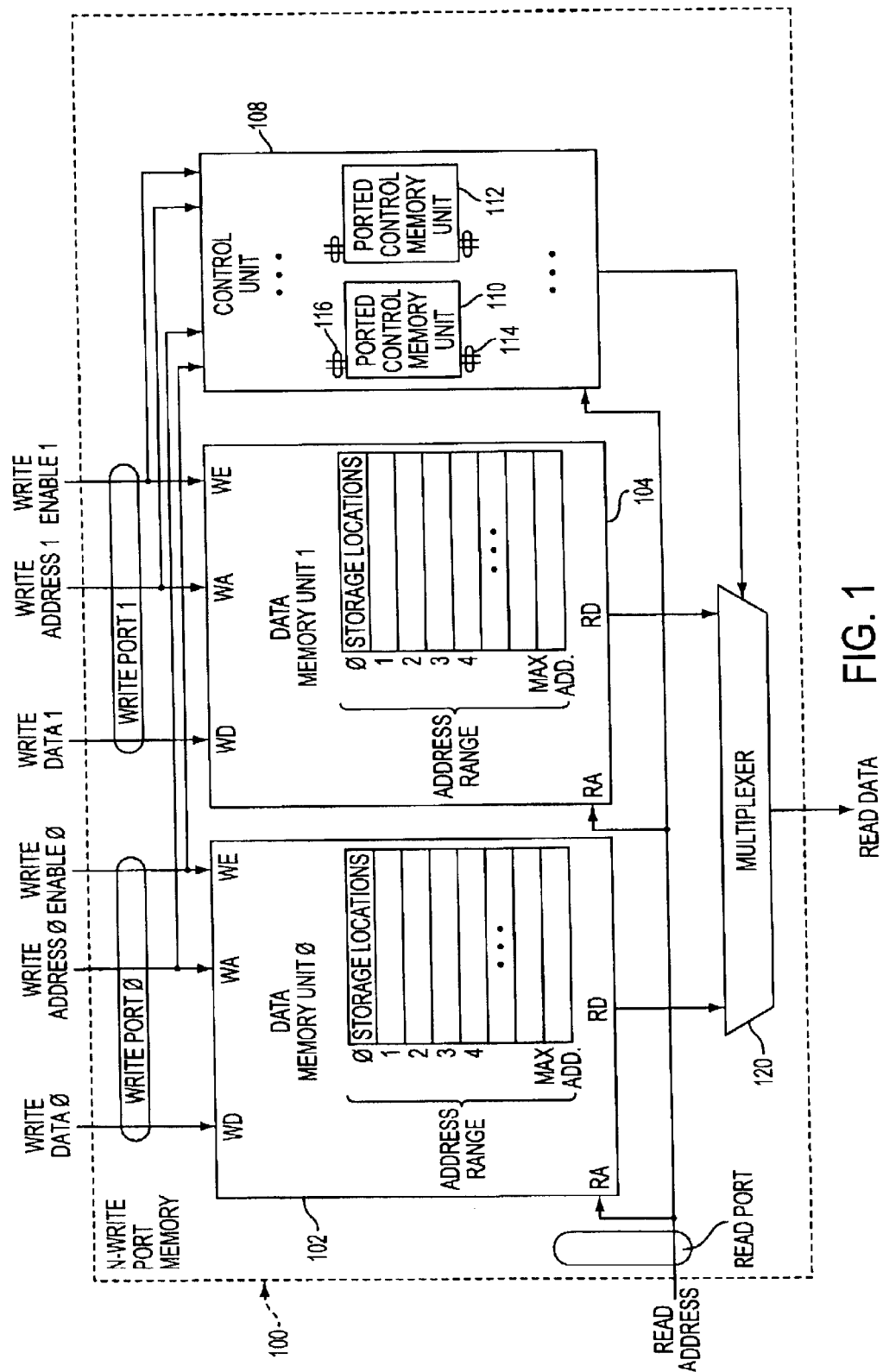
FIG. 1 is a diagram of an exemplary embodiment of the present invention that illustrates a memory constructed of multiple data memory units and a control unit with control memory units having read and write ports.

In an exemplary embodiment of the present invention, a memory, such as memory 100 of FIG. 1, has N write ports, where N is greater than one. The memory comprises a first data memory unit, such as data memory unit 102 of FIG. 1, having a plurality of storage locations addressable by a range of addresses. The first memory unit has less than N write ports. The memory includes a second data memory unit, such as data memory unit 104 of FIG. 1, having a plurality of storage locations addressable by the range of addresses. The second data memory unit has less than N write ports.

In the example of FIG. 1, the data memory units 102 and 104 are implemented with any type of memory device, alone or in combination. Examples of memory devices include static memory, dynamic memory, memories operating at a multiple of the system clock frequency, and the like. The memory devices used to create the data memory units can be designed using a design library such as a Field Programmable Gate Array (FPGA) or Application Specific Integrated Circuit (ASIC) design library. The memory 100 can have a greater number of write ports than the maximum number of write ports available for a memory device selectable using the design library.

Multiple memory devices can be combined to increase the width or depth of the data memory units. Multiple memory devices can also be combined to form data memory units with an increased number of read ports.

In an exemplary embodiment, the memory comprises a control unit configured to select among the first data memory unit and the second data memory unit in response to a read command having an associated read address that falls within the address range.

The control unit, such as control unit 108, can include multiple control memory units, such as the control memory units 110 and 112 of FIG. 1.

In an exemplary embodiment, the control memory units, such as control memory unit 110 of FIG. 1, include read and write ports such as read port 114 and write port 116 of the control memory unit 110 of FIG. 1. The use of a control memory unit with read and write ports allows for efficient storage of the information required to select among the first and second data memory units. Additionally, when the memory is constructed using a design library, component memories with read and write ports can be selected from the design library for use in the control unit.

In an exemplary embodiment, a multiplexer, such as the multiplexer 120 of FIG. 1, is coupled with the first data memory unit and the second data memory unit. The multiplexer is configured to receive a select memory signal from the control unit and to produce read data for the memory. The select memory signal produced by the control unit allows the selection of the correct read data from the different data memory units.

The control unit can be operably connected to the N write ports to receive write addresses and enables provided to the memory. In an exemplary embodiment, the write address and write enable signals are sent to the control unit to enable the control unit to determine the data memory unit that has been most recently written for an addressable location.

A number of different control units with control memory units can be used with the system of the present invention. The control units include control units with a read-modify-write design and control units with a write-only design.

Figure 2:
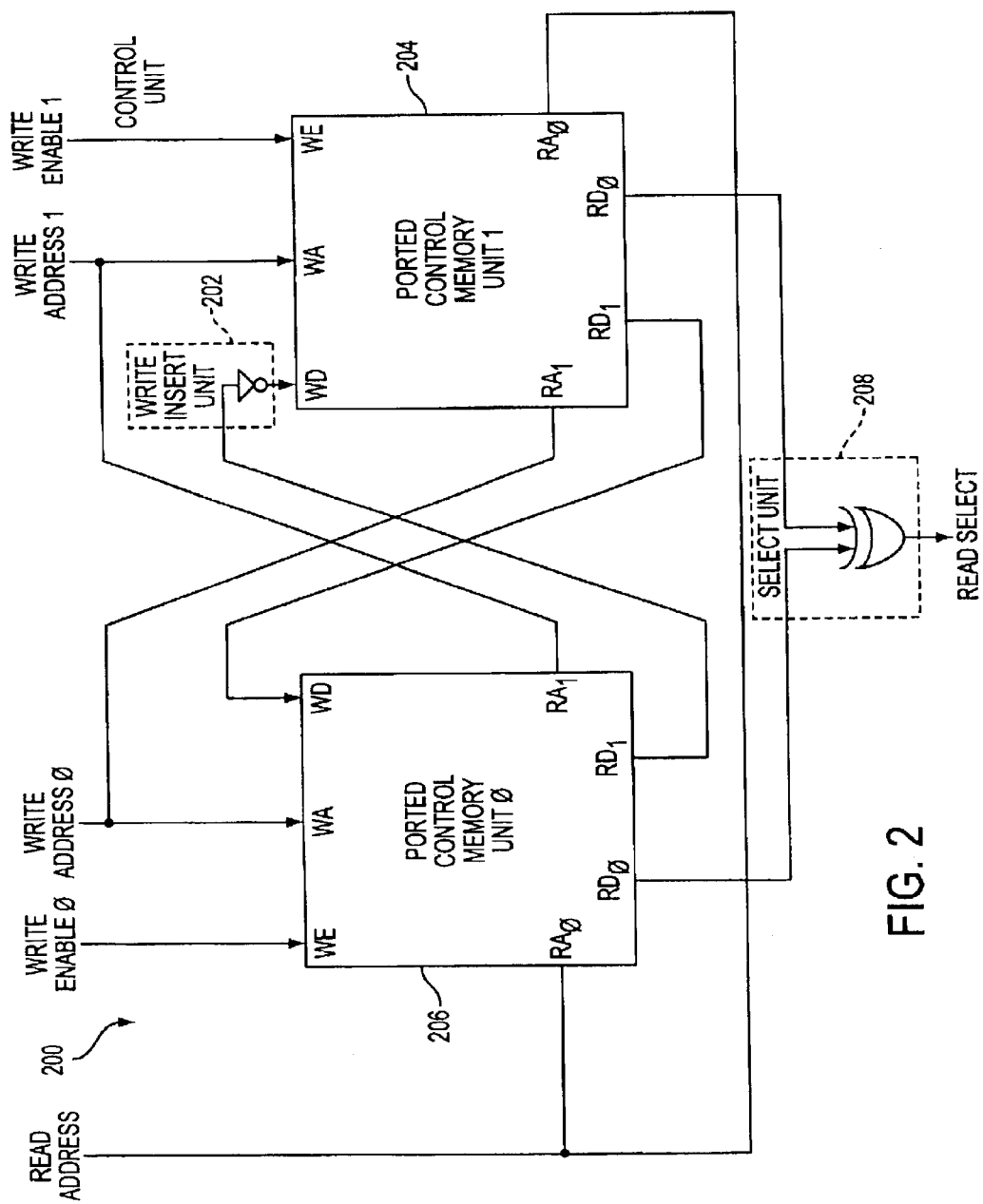
FIG. 2 is a diagram that illustrates an exemplary embodiment of a control unit.

FIG. 2 illustrates a control unit of the read-modify-write design. An advantage of the read-modify-write design over the write-only form is that control memory units with a single write port can be used in the control unit.

In an exemplary embodiment, the control unit, such as the control unit 200 of FIG. 2, is configured to use data from a control memory unit to determine insert data for another control memory unit. The control unit can include at least one write insert unit, such as write insert unit 202 of FIG. 2, configured to produce insert data for one of the control memory units, such as control memory unit 204 of FIG. 2, and configured to receive read data from at least one other control memory unit such as control memory unit 206 of FIG. 2. In one example, the write insert units receive read data from all but one control memory unit.

Read data from the control memory units can be Exclusive-ORed together with a constant to produce the insert data. In the example of FIG. 2, no actual write insert unit is required for control memory unit 206 since the Exclusive-OR of the read value from control memory unit 204 and the constant '0' is just the read value. The write insert unit 202 for control memory unit 204 is an inverter; the inversion of the inverter's input value being equivalent to Exclusive-ORing the value with the constant '1', the constant '1' indicating the data memory unit '1'.

Additional details of the read-modify-write control unit are given in the patent application, MEMORY HAVING MULTIPLE WRITE PORTS AND WRITE INSERT UNIT, AND METHOD OF OPERATION.

In an exemplary embodiment, the control unit includes at least one select unit, such as select unit 208 of FIG. 2. If the memory has more than one read port, the control unit can use multiple select units, a select unit associated with each read port.

Figure 3:
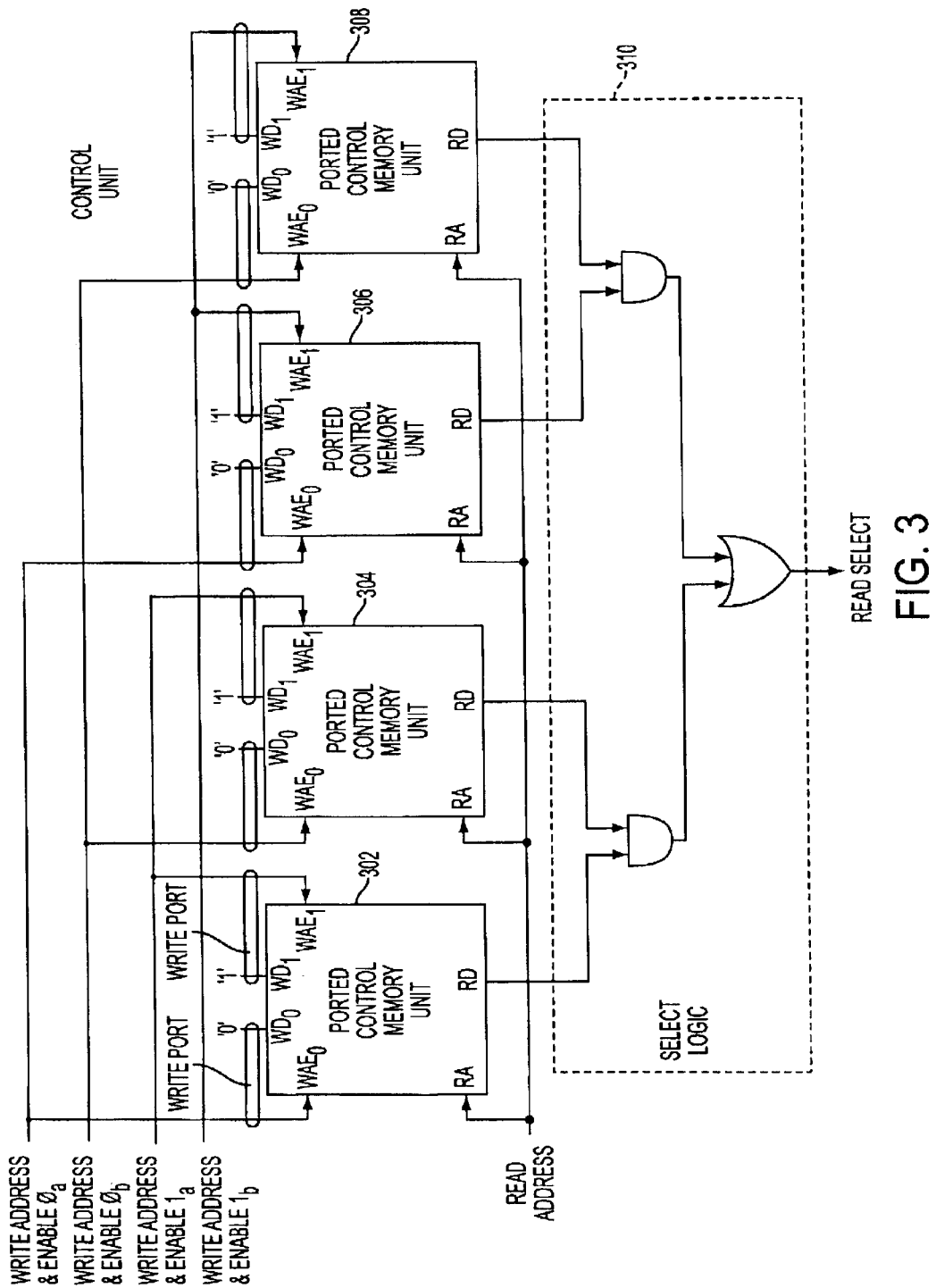
FIG. 3 is a diagram that illustrates an exemplary embodiment of a control unit.

FIG. 3 illustrates an alternate embodiment of a control memory using a write-only design. The write-only design does not require the reading of data from the control memory units in advance of writing the control memory units. The control memory units used in the write-only embodiment require at least two write ports. The control memory unit of FIG. 3 can be used with a system associated with two data memory units, each having two write ports. In the example of FIG. 3, data memory unit '0' has write ports '0a' and '0b', and data memory unit '1' has write ports '1a' and '1b'.

In an exemplary embodiment, one of the multiple control memory units, such as control memory unit 302 of FIG. 3, has first and second write ports, and is configured such that a first value is written through the first write port when a predetermined write port associated with the first data memory unit is used to write, and such that a second value is written through the second write port when another predetermined write port associated with the second data memory unit is used to write.

The first and second values can be constants. In the example of FIG. 1, when write port '0a' is used to write, the constant '0' is written through the first write port of the control memory unit 302. When write port '1a' is used to write, a constant '1' is written through the second write port of the control memory unit 302.

In the example of FIG. 3, each of the control memory units 302, 304, 306 and 308 determine for each address in the address range whether the data was more recently written to the address through a write port associated with data memory unit '0' or a write port associated with data memory unit '1'. In this example, the control memory unit 302 determines for each address in the address range whether the write port '1a' was used to write the address more recently than write port '0a'. The control memory unit 304 determines for each address in the address range whether the write port '1a' was used to write the address more recently than write port '0b'. The control memory unit 306 determines for each address in the address range whether the write port '1b' was used to write the address more recently than write port '0a', and control memory unit 308 determines for each address in the address range whether the write port '1b' was used to write the address more recently than write port '0b'.

In the example of FIG. 3, the outputs of the control memory unit are sent to select logic 310, which produces a select signal that is used to indicate the data memory unit that has been written to most recently for a given address.

Additional details of the write-only control unit are given in the patent application, MEMORY HAVING MULTIPLE WRITE PORTS AND MULTIPLE CONTROL MEMORY UNITS, AND METHOD OF OPERATION.

Although FIG. 1 illustrates two data memory units, more than two data memory units can be used with memories of the present invention. When more than two data memory units are used, the control units use additional control memory units.

Figure 4:
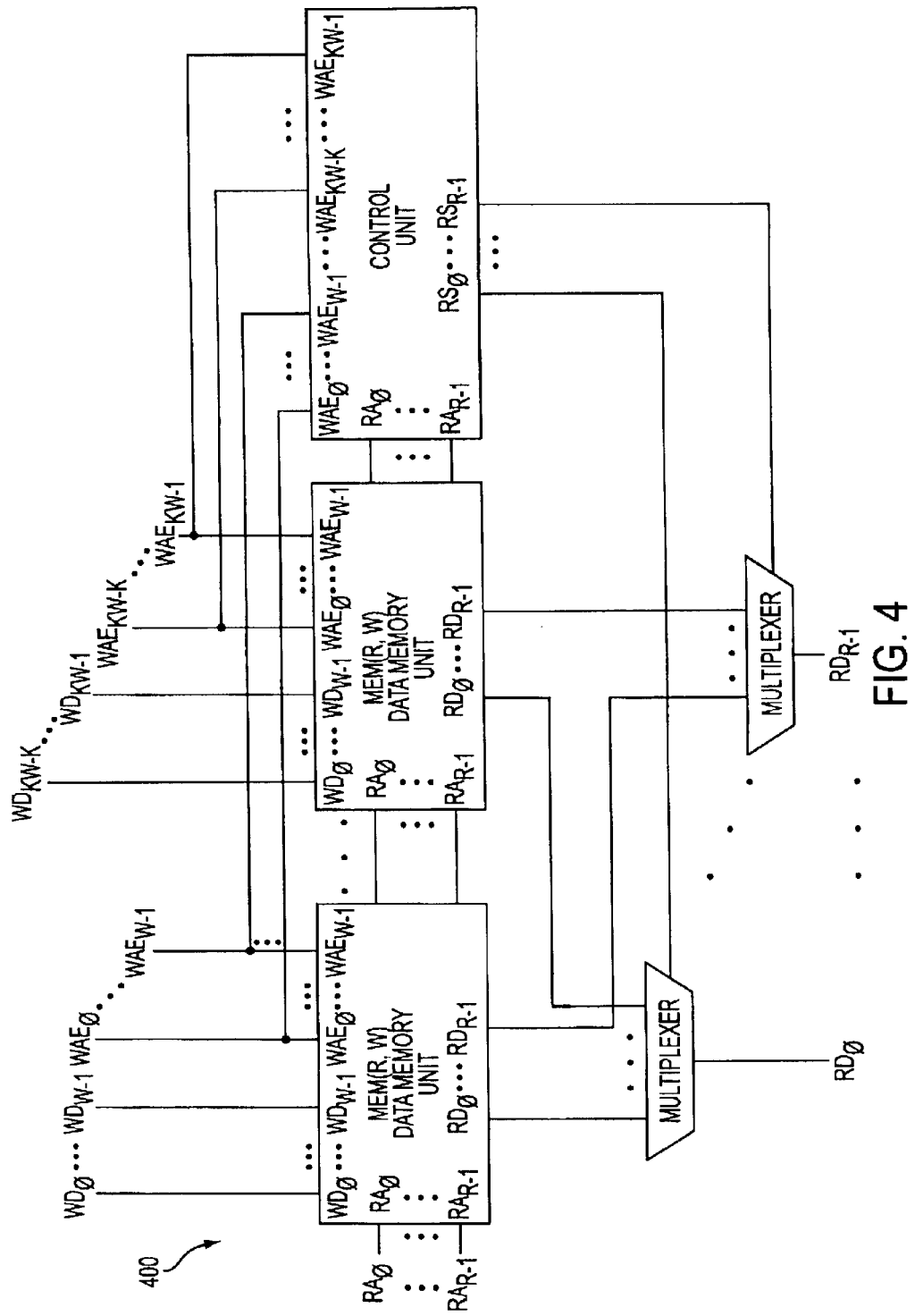
FIG. 4 is a diagram that illustrates memory write port expansion using a control unit of an exemplary embodiment.

FIG. 4 illustrates the write port memory expansion of memory units having R read ports and W write ports by a "write port expansion factor" of K to form a memory having R read ports and W*K write ports. Further, an N write port memory can be constructed from M write port memories by using K=[N/M] data memory units. In the example of FIG. 4, K data memory units are used. Each of the R read address inputs to the memory 400 is connected in common to a read address input of all K data memory units. The memory 400 includes R multiplexers, each receiving one read data output from each of the K data memory units and a select signal from the control unit and producing a read data output of the memory. The read data inputs to a given multiplexer are all associated with the same read address of the memory. The memory 400 includes a control unit with R select units producing R select signals.

Figure 5:
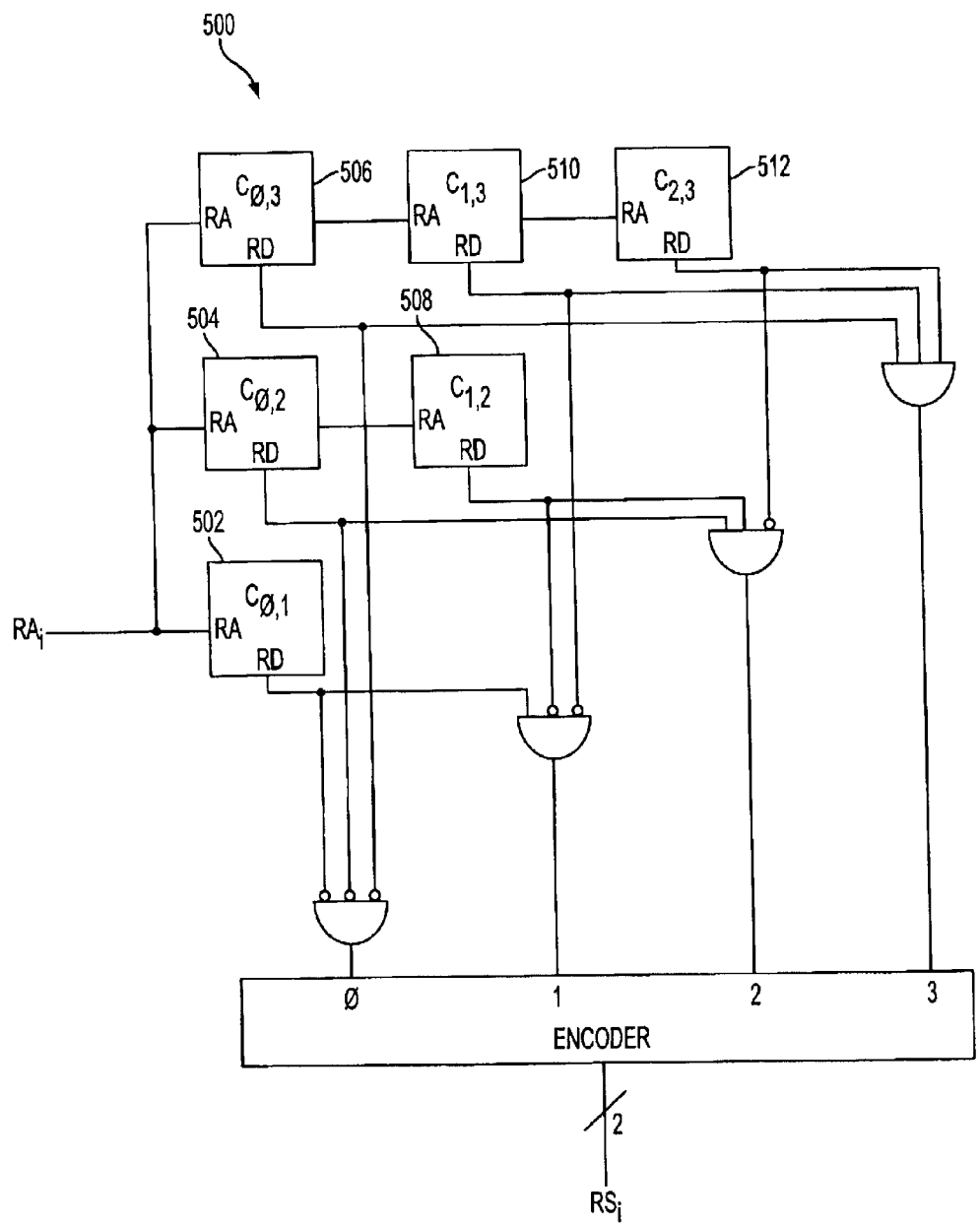
FIGS. 5 and 6 are diagrams that illustrate an exemplary control unit constructed of control subunits.

In an exemplary embodiment, the control unit includes control subunits such as the control subunits 502, 504, 506, 508, 510 and 512 of the control unit 500 of FIG. 5. The control subunits can be produced using a design such as that of FIG. 2 or 3, or an alternate control unit design. Each control subunit is configured to indicate which data memory unit, from a pair of data memory units, was most recently written to for a given address. Logic is used to determine, from all of the subunit output select signals, which data memory unit was most recently written to for a given address. The example of FIG. 5 illustrates the production of a select signal to indicate whether data memory unit '0', data memory unit '1', data memory unit '2' or data memory unit '3' contains the most recent data.

Figure 6:
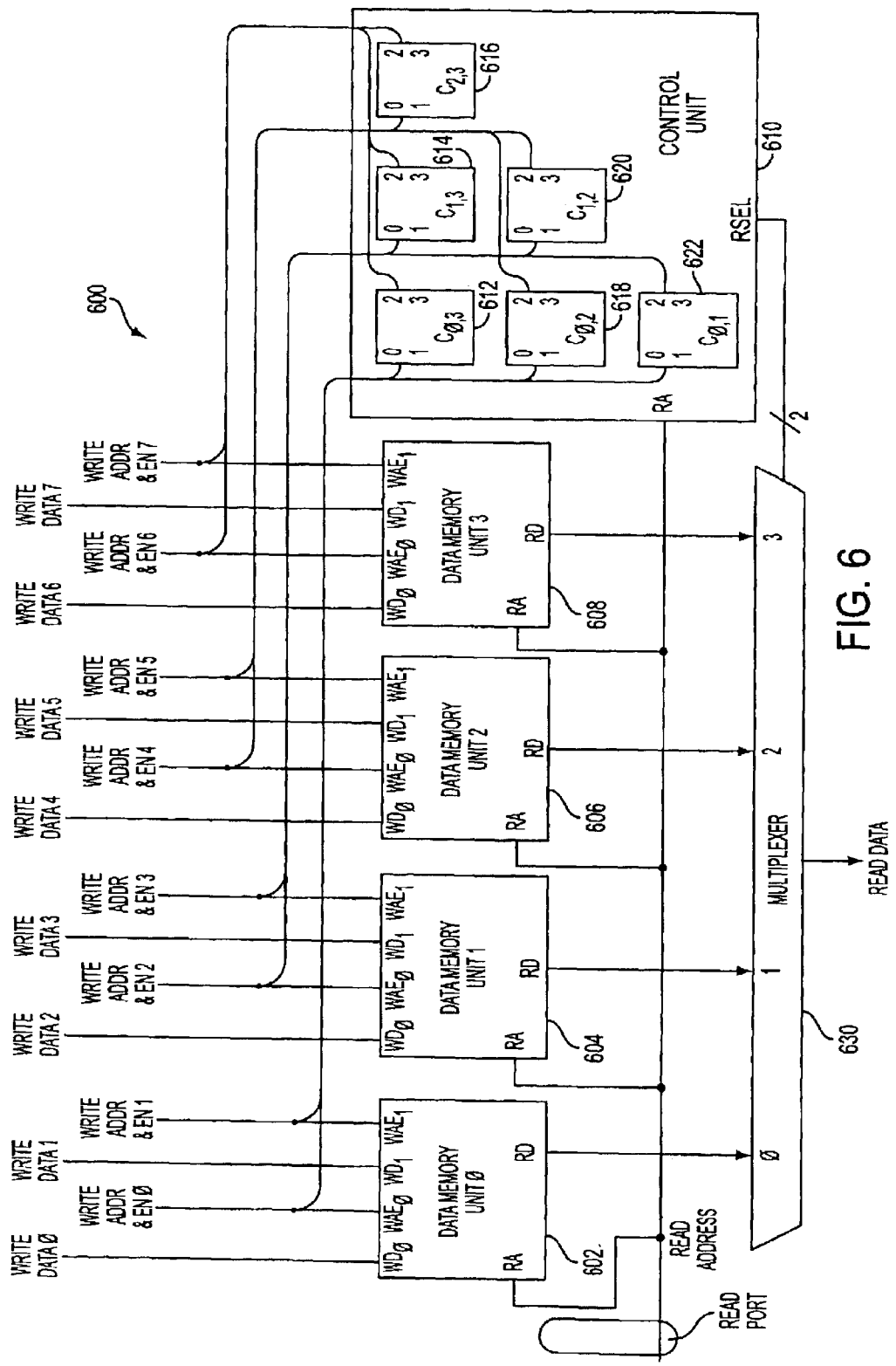

FIG. 6 is a diagram of an exemplary embodiment of the present invention which illustrates a memory 600 constructed of four data memory units: data memory unit 602, data memory unit 604, data memory unit 606 and data memory unit 608. The memory 600 also includes a control unit 610 with six control subunits 612, 614, 616, 618, 620, and 622. The control subunits 612, 614, 616, 618, 620 and 622 determine which data memory unit of the memory units was written to more recently. An example embodiment for each of the control subunits of control unit 610 is shown in FIG. 3. The subunit write port inputs labeled '0', '1', '2', and '3' in FIG. 6 correspond to the write port address and enable input signals labeled '0a', '0b', '1a' and '1b' respectively in FIG. 3. In FIG. 6, the select output is provided to the multiplexer 630. The select output of control unit 610 is generated based on a read address input by read select circuitry, an example of which is shown in FIG. 5.

FIGS. 5 and 6 illustrate the case where the number of data memory units is three or greater and shows how a control unit can be made of control subunits. FIGS. 5 and 6 specifically show an example where there are four data memory units. For an arbitrary number, K, of data memory units, the number of control subunits can be K*(K−1)/2.

The data memory units can have more than one write port. In the example of FIG. 6, the data memory units have two write ports.

Figure 7:
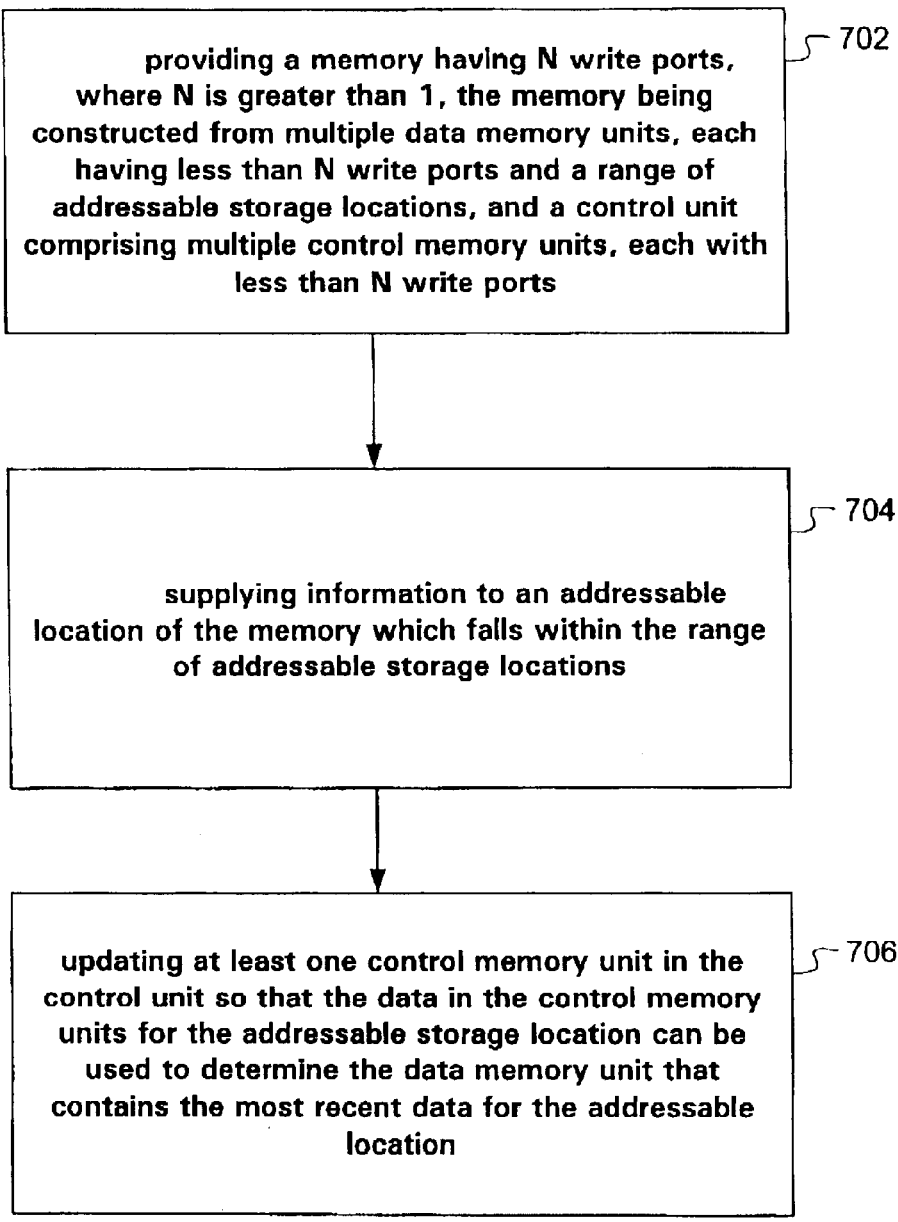
FIG. 7 is a flow chart that illustrates a method of an exemplary embodiment of the present invention.

FIG. 7 is a flow chart that illustrates a method of an exemplary embodiment of the present invention. In step 702, a memory having N write ports, where N is greater than 1 is provided. The memory is constructed from multiple data memory units, each data memory unit having less than N write ports and a range of addressable storage locations. The memory includes a control unit comprising multiple control memory units, each control unit having less than N write ports.

In step 704, information is supplied to an addressable location of the memory which falls within the range of addressable storage locations. In step 706, at least one control memory unit in the control unit is updated so that the data in the control memory units for the addressable storage location can be used to determine the data memory unit that contains the most recent data for the addressable location.

The updating of the control memory unit can comprise writing a first value through a first write port of the control memory unit when a predetermined write port associated with a first data memory unit is used to write and writing a second value through a second write port of the control memory unit when another predetermined write port associated with a second data memory unit is used to write. In this example, the first and second values are determined independently of data read from a control memory unit.

The updating of the control memory unit can include reading at least one value of at least one control memory unit, determining an insert value from the at least one value of at least one control memory unit, and writing the insert value into a control memory unit.

The method can include sending a read command and an associated address to the memory; retrieving data values from each of the multiple data memory units; and selecting one of the data values to provide a current value.

Figure 8:
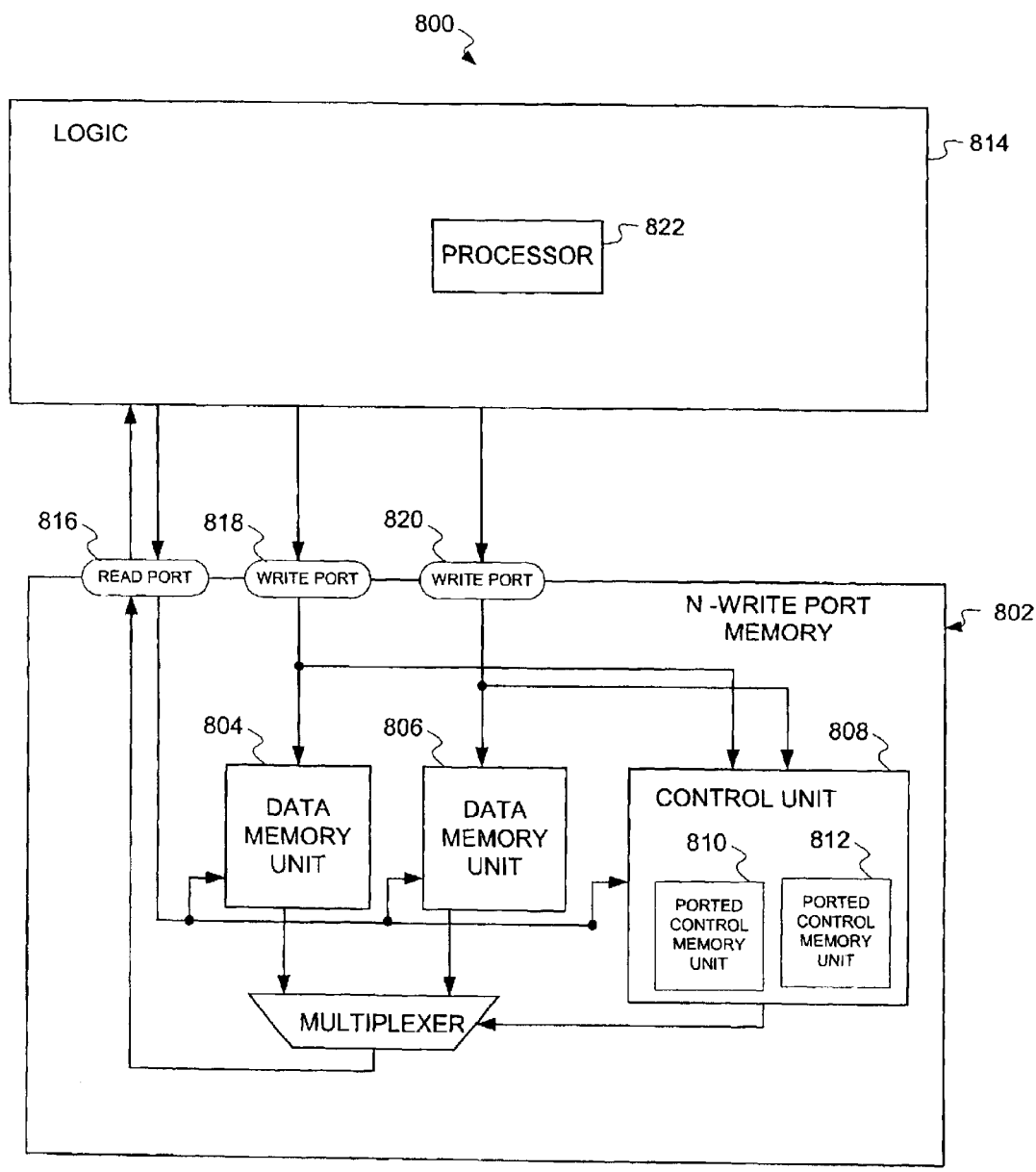
FIG. 8 is a diagram of an exemplary embodiment of a system including a memory constructed of multiple data memory units and a control unit.

FIG. 8 is a diagram of an exemplary embodiment of a system 800 including a memory 802 constructed of multiple data memory units 804 and 806 and a control unit 808.

The memory 802 has N write ports, wherein N is greater than 1. The memory 802 includes a first data memory unit 804 having a plurality of storage locations addressable by a range of addresses. The first data memory unit 804 has less than N write ports. The memory 802 includes a second data memory unit 806 having a plurality of storage locations addressable by the range of addresses. The second data memory unit 806 has less than N write ports. The memory 802 includes a control unit 808 configured to select among the first data memory unit 804 and the second data memory unit 806 in response to a read command having an associated read address which falls within the address range. The control unit 808 includes multiple control memory units 810 and 812 each with less than N write ports.

The system 800 includes logic 814 configured to access the memory 802. In the example of FIG. 8, the logic 814 accesses the memory using read port 816 and write ports 818 and 820.

The logic 814 can include a processor 822. The processor 822 can be part or all of the logic 814.

The logic 814 and the memory 802 can be on a single chip. This chip can be a reconfigurable logic chip or another type of chip such as an ASIC.

The logic 814 and the memory 802 can be on different chips. In one embodiment, the logic 814 comprises a processor chip and the memory 802 is part of a separate chip, such as a reconfigurable logic chip or an ASIC.

The control unit 808 can be configured to use data read from a control memory unit to determine insert data for another control memory unit. An example of such a control unit is shown in FIG. 2.

One of the multiple control memory units of the control unit 808 can have first and second write ports and be configured such that a first value is written through the first write port when a predetermined write port associated with the first data memory unit is used to write and such that a second value is written through the second write port when another predetermined write port associated with the second data memory unit is used to write. In this example, the first and second values are determined independently of data read from a control memory unit. FIG. 3 shows such a control unit.

While there has been described what are believed to be the preferred embodiments of the present invention, those skilled in the art will recognize that other and further changes and modifications may be made thereto without departing from the spirit of the invention which is defined by the appended claims, and it is intended to claim all such changes and modifications as fall within the true scope of the invention. The presently disclosed embodiments are therefore considered in all respects to be illustrative and not restricted. The scope of the invention described by the foregoing includes all changes that come within the meaning, range and equivalence thereof and is intended to be embraced therein.

What is claimed is:

1. A memory having N write ports, wherein N is greater than 1, comprising:
    a first data memory unit having a plurality of storage locations addressable by a range of addresses, and having less than N write ports;
    a second data memory unit having a plurality of storage locations addressable by the range of addresses, the second data memory unit having less than N write ports; and
    a control unit configured to select among the first data memory unit and the second data memory unit in response to a read command having an associated read address which falls within the address range, the control unit including multiple control memory units each with less than N write ports.

2. The memory of claim 1, comprising a multiplexer coupled with the first data memory unit and the second data memory unit, the multiplexer configured to receive a select memory signal from the control unit and to produce read data for the memory.

3. The memory of claim 1, wherein the control unit is operably connected to the N write ports to receive write addresses and write enables provided to the memory.

4. The memory of claim 1, wherein the control unit is configured to use data read from a control memory unit to determine insert data for another control memory unit.

5. The memory of claim 1, wherein the control unit includes at least one write-insert unit configured to produce insert data for one of the control memory units, the at least one write-insert unit configured to receive read data from at least one other control memory unit.

6. The memory of claim 1, wherein the control unit comprises at least one select unit receiving read data from the control memory units at the associated read address, the at least one select unit producing a select memory signal.

7. The memory of claim 6, wherein the memory has more than one read port and the control unit has a select unit associated with each read port.

8. The memory of claim 1 wherein one of the multiple control memory units has first and second write ports and is configured such that a first value is written through the first write port when a predetermined write port associated with the first data memory unit is used to write and such that a second value is written through the second write port when another predetermined write port associated with the second data memory unit is used to write and the first and second values are determined independently of data read from a control memory unit.

9. The memory of claim 8, wherein the first and second values are constants.

10. The memory of claim 1, wherein the control unit includes control subunits configured to select, from a pair of data memory units, the data memory unit that was most recently written to for an address.

11. The memory of claim 1, wherein the data memory units have more than one write port.

12. A method for operating a memory comprising:
    providing a memory having N write ports, where N is greater than 1, the memory being constructed from multiple data memory units, each having less than N write ports and a range of addressable storage locations, and a control unit comprising multiple control memory units, each with less than N write ports;
    supplying information to an addressable location of the memory which falls within the range of addressable storage locations; and
    updating at least one control memory unit in the control unit so that the data in the control memory units for the addressable storage location can be used to determine the data memory unit that contains the most recent data for the addressable location.

13. The method of claim 12, wherein the updating step comprises writing a first value through a first write port of the control memory unit when a predetermined write port associated with a first data memory unit is used to write and by writing a second value through a second write port of the control memory unit when another predetermined write port associated with a second data memory unit is used to write and the first and second values are determined independently of data read from a control memory unit.

14. The method of claim 12 wherein the updating step includes reading at least one value of at least one control memory unit, determining an insert value from the at least one value of at least one control memory unit; and writing the insert value into a control memory unit.

15. The method of claim 12, comprising:
    sending a read command and an associated address to the memory;
    retrieving data values from each of the multiple data memory units; and
    selecting one of the data values to provide a current value.

16. A system comprising:
    a memory having N write ports, wherein N is greater than 1, the memory including a first data memory unit having a plurality of storage locations addressable by a range of addresses, and having less than N write ports, the memory including a second data memory unit having a plurality of storage locations addressable by the range of addresses, the second data memory unit having less than N write ports; and a control unit configured to select among the first data memory unit and the second data memory unit in response to a read command having an associated read address which falls within the address range, the control unit including multiple control memory units each with less than N write ports; and logic configured to access the memory.

17. The system of claim 16, wherein the logic includes a processor.

18. The system of claim 16, wherein the logic and the memory are on a single chip.

19. The system of claim 18, wherein the chip is a reconfigurable logic chip.

20. The system of claim 16, wherein the logic and the memory are on different chips.

21. The system of claim 16, wherein the control unit is configured to use data read from a control memory unit to determine insert data for another control memory unit.

22. The system of claim 16 wherein one of the multiple control memory units has first and second write ports and is configured such that a first value is written through the first write port when a predetermined write port associated with the first data memory unit is used to write and such that a second value is written through the second write port when another predetermined write port associated with the second data memory unit is used to write and the first and second values are determined independently of data read from a control memory unit.

* * * * *